United States Patent
Horovitz et al.

(10) Patent No.: US 10,804,911 B2
(45) Date of Patent: Oct. 13, 2020

(54) FREQUENCY SYNTHESIS WITH REFERENCE SIGNAL GENERATED BY OPPORTUNISTIC PHASE LOCKED LOOP

(71) Applicant: Intel Corporation, Santa Clara, CA (US)

(72) Inventors: Gil Horovitz, Emek-Hefer (IL); Sharon Malevsky, Tel-Aviv (IL); Evgeny Shumaker, Nesher (IL); Igal Kushnir, Hod-Hasharon (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/292,717

(22) Filed: Mar. 5, 2019

(65) Prior Publication Data
US 2020/0287557 A1  Sep. 10, 2020

(51) Int. Cl.
*H03L 7/099* (2006.01)
*H04B 1/00* (2006.01)

(52) U.S. Cl.
CPC ......... *H03L 7/0992* (2013.01); *H04B 1/0082* (2013.01); *H03L 2207/50* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,438,599 A | * | 8/1995 | Lincoln | H03K 3/011 324/76.62 |
| 5,726,607 A | * | 3/1998 | Brede | H03L 7/07 331/14 |
| 8,731,505 B2 | | 5/2014 | Leme et al. | |
| 9,356,606 B2 | | 5/2016 | Caffee et al. | |
| 2002/0191727 A1 | * | 12/2002 | Staszewski | H03C 3/0966 375/376 |
| 2011/0007859 A1 | | 1/2011 | Ueda et al. | |
| 2013/0086410 A1 | | 4/2013 | Kurd et al. | |
| 2018/0091180 A1 | | 3/2018 | Kushnir et al. | |

* cited by examiner

*Primary Examiner* — Junpeng Chen
(74) *Attorney, Agent, or Firm* — 2SPL Patent Attorneys PartG mbB

(57) ABSTRACT

Systems, methods, and circuitries are provided to generate a radio frequency (RF) signal having a desired radio frequency $f_{RF}$. In one example a frequency synthesizer system includes a clock, an opportunistic phase locked loop (PLL), and an RF PLL. The clock circuitry is configured to generate a clock signal having a frequency $f_{XTL}$. The opportunistic phase locked loop (PLL) is configured to generate a reference signal having a reference frequency $f_{REF}$ that is close to a free-running frequency of an oscillator in the opportunistic PLL. The opportunistic PLL is configured to synchronize the reference signal to the clock signal. The RF PLL is configured to generate the RF signal having the desired radio frequency and to synchronize the RF signal with the reference signal.

20 Claims, 5 Drawing Sheets

FREQUENCY SYNTHESIS WITH REFERENCE SIGNAL GENERATED BY OPPORTUNISTIC PHASE LOCKED LOOP

BACKGROUND

Phase locked loops (PLLs) are often used to generate local oscillator (LO) signals at arbitrary frequencies for converting signals between the baseband and RF domains in a device. A PLL synchronizes the RF signal being generated by an oscillator circuit with a reference signal to ensure that that the RF signal is phase-aligned with respect to other signals in the device.

DESCRIPTION

Radio frequency (RF) communication systems rely on generating RF signals having a wide range of frequencies. As throughput of devices increases so does the demand for the spectral purity of the RF signals. The next generation of radio transceiver standards (such as advanced LTE, 5G millimeter-wave and 802.11ax Wi-Fi) impose extremely high requirements on the spectral purity of local frequency oscillators (LO) while at the same time demanding dense channel spacing in a broad spectral range.

Figure 1:
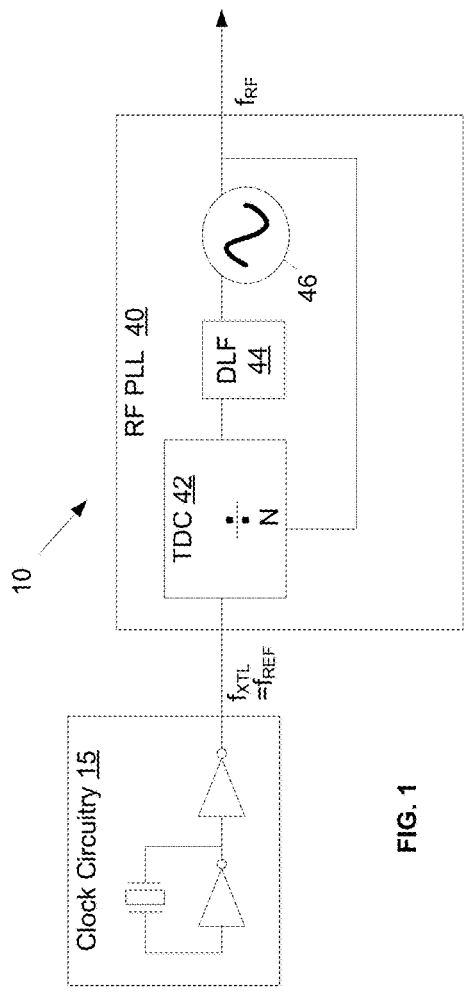
FIG. 1 illustrates an exemplary frequency synthesizer system that uses crystal-based clock circuitry to generate a reference signal for an RF PLL.

All digital phase locked loops (ADPLLs) are commonly used for local frequency generation in communication systems. These systems use a fixed frequency reference standard (often referred to as a REF clock) which is usually based on a highly stable quartz or crystal resonator. FIG. 1 illustrates a typical ADPLL based frequency synthesizer system 10 that utilizes a fixed reference signal generated by a crystal based clock circuitry 15 to generate an RF signal having frequency $f_{RF}$. An RF PLL 40 locks the phase of a high-frequency oscillator 46 to the clock signal (having relatively low frequency $f_{XTL}$). While the clock circuitry 15 includes a crystal, any other clock circuitry that is used to synchronize the operation of components across multiple circuits may be used to implement the clock circuitry 15. The term PLL as used herein includes ADPLLs as well as any other PLL and should not be limited to refer only to ADPLLs.

A time-to-digital converter (TDC) 42 quantifies a phase difference between the reference signal and the RF signal output by the RF PLL 40. Out of this digital difference, the phase error is computed. The TDC 42 is operated to quantify the phase difference between an edge of the clock signal and every Nth edge of the RF signal, which is equivalent to "dividing" the feedback RF signal frequency by N. The quantity N (called the ratio herein), which can be an integer or an integer portion combined with a sub-integer portion, is used by the PLL to control the relationship between $f_{RF}$ and $f_{REF}$.

The phase error output by the TDC 42 is filtered by a digital loop filter 44 and the filtered signal is used to adjust the high-frequency digitally controlled oscillator (DCO) 46 to bring the RF signal into phase with the clock signal. The operation of the RF PLL 40 can be viewed as a filtered frequency multiplication of reference signal (by ratio N) to generate the RF signal. While in this description the multiplication/division by the ratio is conceptually illustrated as being a function of the TDC, the systems, methods, and circuitries described herein are also applicable to PLLs in which different circuitry performs this operation.

Depending on the fractional frequency generation technique employed (either divider-less or sigma-delta driven multiple modulus divider (MMD) based). The periodic phase errors can manifest themselves in the form of coherent spurious signals or an elevated in-band noise floor. In the case of a divider-less ADPLL periodic phase errors acquire spurious manifestation and are called fractional spurs. The phase noise performance of an ADPLL is dominated by the clock signal phase noise behavior and the periodic phase errors generated in the ADPLL due to the ratio N ($f_{RF}/f_{REF}$). To improve the ADPLL phase noise performance high frequency and therefore prohibitively expensive crystals are used. Hence, there is an inherent limit on achievable RF signal spectral purity.

Main drawbacks of using a fixed reference frequency as in system 10 include performance limitations and periodic errors. Reference signal noise scales according to 20 $\log_{10}$ ($f_{RF}/f_{REF}$) (recall that $f_{RF}/f_{REF}$=N). Thus, performance is degraded as the ratio between the desired RF frequency and the fixed reference signal frequency increases. This means that performance is limited to the ranges producible by crystal-based oscillators. Further, significant periodic errors occur due to the nature of the fractional PLL which limits usability in dense channelization standards, such as 5G.

Described herein are systems, circuitries, and methods that produce an RF signal with a high spectral purity by using an opportunistic PLL to generate a reference signal of intermediate frequency that is synchronized with a low frequency oscillator such as a crystal oscillator. The opportunistic PLL includes a high-performance narrow bandwidth DCO that generates a reference signal having an arbitrary, but modestly tunable, frequency which helps to alleviate performance impairments common to fractional frequency synthesis and provides a wide choice of effective ratios in each of the locked loops (opportunistic and RF). In this manner a very low jitter PLL is created which is locked to an arbitrary frequency (called herein "opportunistic") using a narrow bandwidth digitally controlled oscillator (DCO) (featuring low parasitic content due having limited tuning mechanisms). This high-performance DCO enables the opportunistic PLL to apply a narrow phase-locking bandwidth, which in turn contributes significant filtering of fractional spurs and alleviating other problems caused by use of reference signals having a fixed relatively low frequency. The systems, circuitries, and methods described herein handle and mitigate in-band noise and spurious signals as well as introducing a better trade-off for high-performance PLLs.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable storage medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

Use of the word example is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

Figure 2:
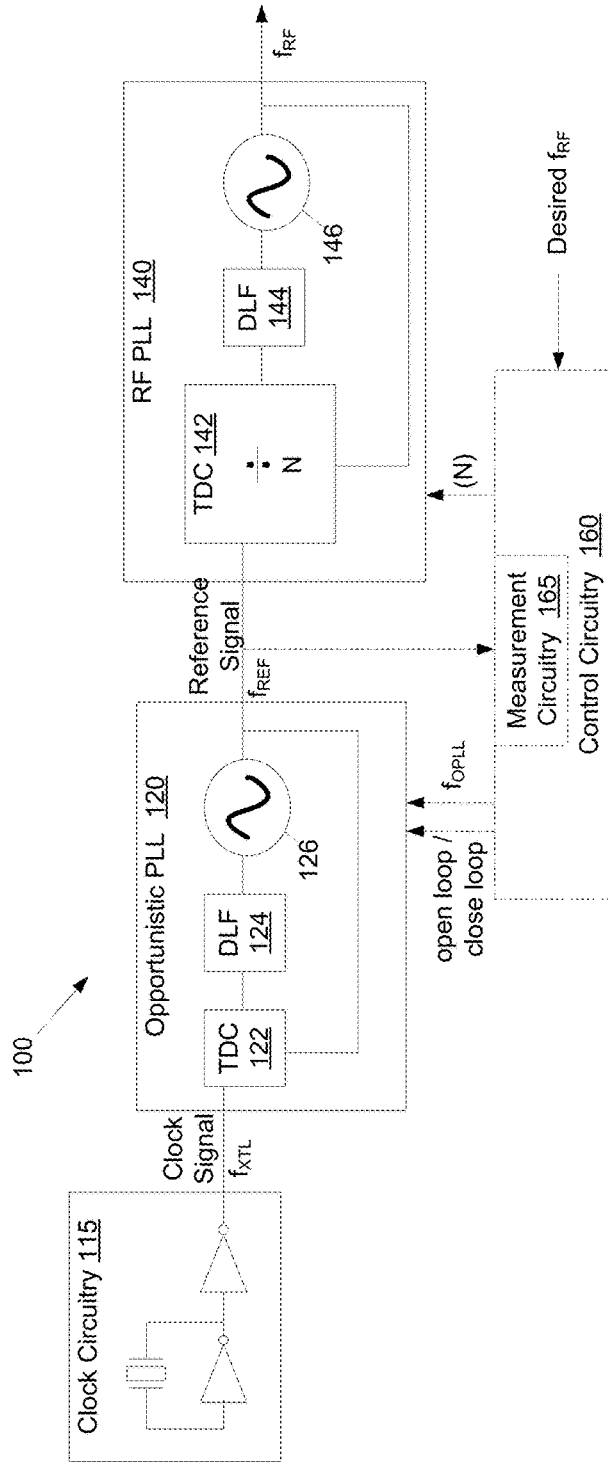
FIG. 2 illustrates an exemplary frequency synthesizer system that includes an opportunistic PLL generating a reference signal for an RF PLL in accordance with various aspects described.

FIG. 2 illustrates an exemplary frequency synthesizer system 100 that includes an opportunistic PLL 120 to generate a reference signal for an RF PLL 140. The frequency of the reference signal generated by the opportunistic PLL 120 is about two orders of magnitude greater than frequencies that can be produced by a crystal based clock circuitry 115 while preserving or even improving the phase noise quality. The clock signal produced by the clock circuitry 115, which has a frequency $f_{XTL}$, is used to lock the long-term phase drift of a high-performance oscillator 126 (in one example the oscillator 126 is a DCO) without compensating for the center frequency shift of the oscillator 126 due to power/voltage/temperature (PVT) changes. The oscillator 126 is controlled to generate a reference signal having frequency $f_{REF}$ that is chosen to coincide with an optimum oscillation frequency dictated by the process where the figure of merit (FOM) is optimized. The oscillator 126 has a modest tuning range (less than 1% or on the order of $f_{XTL}$) which means that many noise-producing tuning components such as switched capacitor banks can be eliminated, greatly enhancing the stability of the reference signal generated by the opportunistic PLL 120.

For the purposes of this description, the term "opportunistic PLL" includes low-power, narrow bandwidth oscillators that are locked to a low frequency crystal-based clock circuitry (or other low frequency system clock source). To generate the reference signal, the opportunistic PLL is first operated in an open-loop mode in which the oscillator (or DCO) in the opportunistic PLL operates at a frequency at or near its free-running (or uncompensated or natural) frequency. The opportunistic PLL is then operated in closed loop mode so that the reference signal is synchronized with the clock signal. Once locked into phase with the reference clock, the phase of the signal produced by the opportunistic PLL does not vary appreciably over time and can be considered to be deterministic while the frequency will have a value that is dependent on the operating conditions of the oscillator when the loop is locked. The oscillator in the opportunistic PLL is capable of tuning only within a narrow range around its free-running frequency. Thus the reference signal produced by the opportunistic PLL 120 will have a high spectral purity and an operating frequency that is mainly determined by the optimum oscillator frequency for given manufacturing processes with some limited tunability. By employing a narrow bandwidth loop, both the clock circuitry and TDC contributed noise and errors are significantly suppressed, which allows for use of a low cost crystal in the clock circuitry 115 and a low power TDC.

The opportunistic PLL 120, when used as a source for the reference signal for the RF PLL 140, provides two advantages over directly using the clock signal as the reference signal for the RF PLL 140. These advantages are the increased frequency of the reference signal and the ability to make (minor) adjustments to the reference frequency. In common design practice (FIG. 1) the noise contribution of the crystal oscillator in the clock circuitry can be calculated via $$PN_{XO} + 20\log_{10}\frac{F_{RF}}{F_{REF}} \qquad \text{EQ. 1}$$

Thus, for instance, a 60 MHz crystal oscillator phase noise that flattens at 1 MHz offset to a noise floor of −160 dBc/Hz, when used as a clock circuitry for a PLL that generates an RF signal at 6 GHz will contribute an equivalent noise of $$-160\frac{\text{dBc}}{\text{Hz}} + 20\log_{10}\frac{6\text{ GHz}}{60\text{ MHz}} = -120\frac{\text{dBc}}{\text{Hz}} \qquad \text{EQ. 2}$$

When a high performance 3 GHz DCO, featuring a phase noise of $$-135\frac{\text{dBc}}{\text{Hz}}$$

at 1 MHz offset, is used to generate the reference signal, it will have contributed to the same 6 GHz signal significantly less phase noise $$-135\frac{\text{dBc}}{\text{Hz}} + 20\log_{10}\frac{6\text{ GHz}}{3\text{ GHz}} = -129\frac{\text{dBc}}{\text{Hz}} \qquad \text{EQ. 3}$$

It can be seen that by using a high frequency (as compared to the clock signal frequency) reference signal the phase noise is reduced by 9 dB. Furthermore, by using a higher frequency reference signal, quantization error of the TDC 122 is spread over larger bandwidth, and hence its density decreases by the ratio between reference signal's high frequency and the XTAL frequency.

Having control over the reference frequency (by tuning the oscillator 126) provides the ability to operate the RF PLL 140 using a ratio N that is selected to generate an RF signal in which spurs are located far out of band and/or are highly rejected by the digital loop filter (DLF) 144. A fractional spur is a periodic error created by the phase wrapping in the TDC 142 (in a first order sigma-delta divider-less DPLL). When the ratio is close (but not equal) to either an integer or sub-integer (1-over-small-number), the error has a period that is close to the RF signal frequency. This makes it extremely difficult to filter out the error due to the low-pass nature of the clock circuitry transfer function. The variable reference signal frequency allows the frequency synthesizer system 100 to avoid periodic phase errors in the RF PLL 140 by selecting the ratios used in the opportunistic PLL 120 and the RF PLL 140 so that any resulting periodic error is filtered out by at least one of the closed loop transfer functions.

Recall that the frequency of the reference signal is not set a priori, but rather is an optimum (e.g., free-running) frequency that is locked into phase with the clock signal. This means that the reference signal frequency should be measured. Control circuitry 160 includes measurement circuitry 165 configured to measure the frequency of the reference signal. Based on this measured reference frequency and the desired RF frequency, the control circuitry determines a "good" ratio N that tends to avoid periodic phase errors. The control circuitry 160 then controls or adjusts the oscillator 126 to compensate for the selected ratio N such that the reference signal, when multiplied by the RF PLL ratio, will generate the desired RF frequency. In one example, the measurement circuitry 165 includes a simple cycle counter. The measurement circuitry 165 may also combine the measurement of the counter with information gathered by the TDC 122.

Because the reference frequency is determined based on the free-running frequency of the oscillator in the opportunistic PLL and the oscillator has a very limited tuning capability, as operating conditions change a "new" reference frequency may be selected that reflects the characteristics of the oscillator in the new operating conditions. the control circuitry 160 is configured to monitor certain "re-calibration" criteria such as temperature, supply power, elapsed time since a last calibration, or even a change in the desired RF signal frequency. In response to a re-calibration criterion being met, the control circuitry 160 controls the opportunistic PLL to generate a new reference signal by operating in an open loop condition such that the oscillator 126 operates at a new free-running frequency for the oscillator and then the control circuitry controls the opportunistic PLL to operate in a closed loop condition ("locking the loop") such that a new $f_{REF}$ is approximately the new free-running frequency and the new reference signal is synchronized with the clock signal. The control circuitry 160 then controls the RF PLL 140 to determine a new ratio (N) between a new measured $f_{REF}$ and the RF frequency; adjust the new $f_{REF}$ based on the ratio; and control the DCO 146 based on a phase difference between the new reference signal and the feedback RF signal to synchronize the RF signal with the new reference signal.

Figure 3:
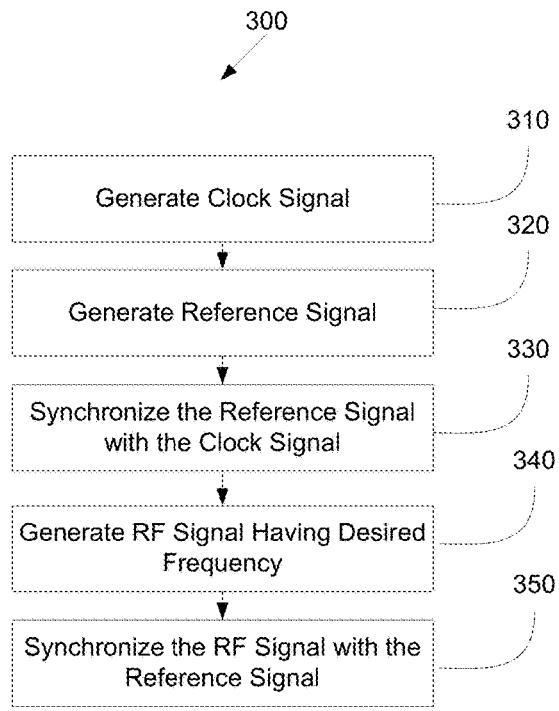
FIG. 3 illustrates an exemplary flow diagram of an exemplary method of generating an RF signal having a desired RF frequency in accordance with various aspects described.

FIG. 3 illustrates a flow diagram of an exemplary method 300 to generate a desired radio frequency (RF) signal having a desired RF frequency $f_{RF}$. The method 300 may be performed, for example, by the frequency synthesizer system 100 of FIG. 2. The method includes, at 310, with a clock circuitry, generating a clock signal having a frequency $f_{XTL}$. At 320, the method includes generating a reference signal having a reference frequency $f_{REF}$. At 330 the method includes synchronizing the reference signal with the clock signal with an opportunistic phase locked loop (PLL). At 340 the RF signal having the desired radio frequency is generated. At 350, the method includes synchronizing the RF signal with the reference signal using an RF PLL.

Figure 4:
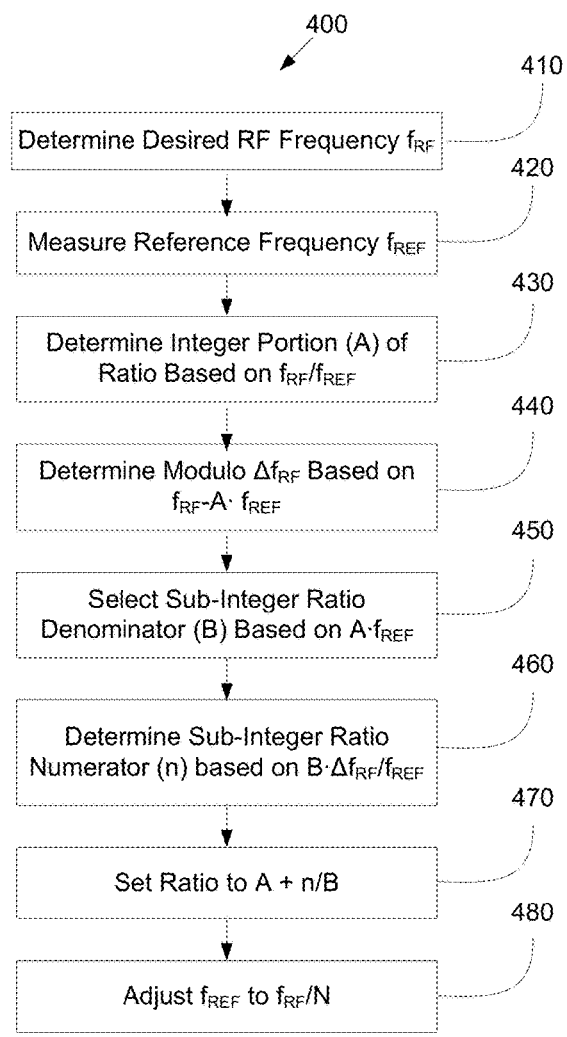
FIG. 4 illustrates an exemplary flow diagram of another exemplary method of generating an RF signal having a desired RF frequency in accordance with various aspects described.

FIG. 4 illustrates a flow diagram of an exemplary method that may be performed by control circuitry of the frequency synthesizer system 100 of FIG. 2 to determine an integer portion and sub-integer portion of the ratio N used by the TDC 142. The method includes, at 410, determining the desired $f_{RF}$. At 420, the reference frequency $f_{REF}$ is measured directly and/or using information from PLL components. At 430, an integer portion (A) of the ratio (or band selection) is determined based on $f_{RF}/f_{REF}$. The method includes, at 440, determining a frequency modulo $\Delta f_{RF}$ based on $f_{RF}-A \cdot f_{REF}$ and, at 450, selecting a sub-integer ratio denominator (B) (or resolution of the intra-integer tuning) based on the frequency modulo. At 460 a closest sub-integer ratio numerator (n) is determined based on $B \cdot \Delta f_{RF}/f_{REF}$. At 470 the ratio (N) for RF PLL 140 is set to A+n/B. At 480 the opportunistic PLL is controlled to generate a reference signal having the reference frequency $f_{RF}/N$. In other examples, different methods may be used to determine or set the integer and sub-integer portions of the ratio based on a measured reference frequency and a desired RF frequency.

Figure 5:
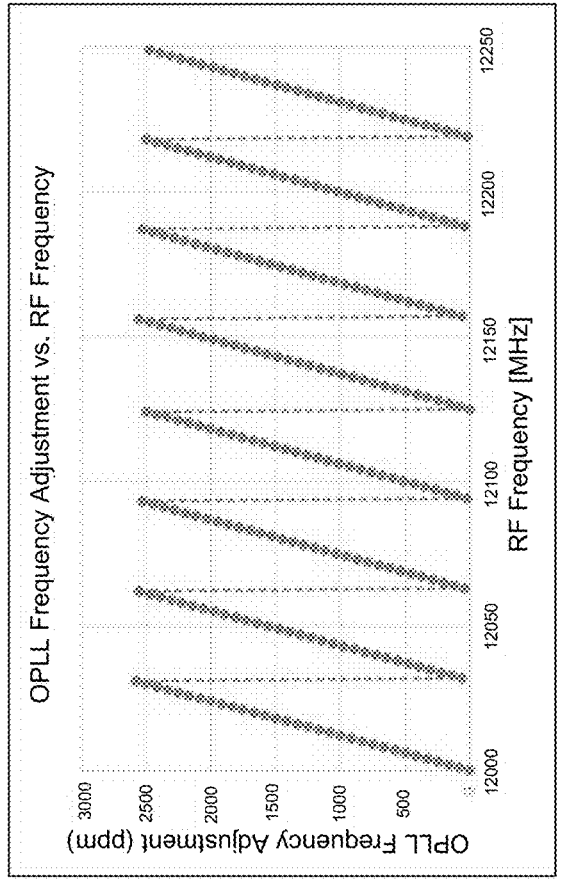
FIG. 5 illustrates an exemplary opportunistic PLL frequency adjustment range mapped to an exemplary RF frequency band in accordance with various aspects described.
Figure 6:
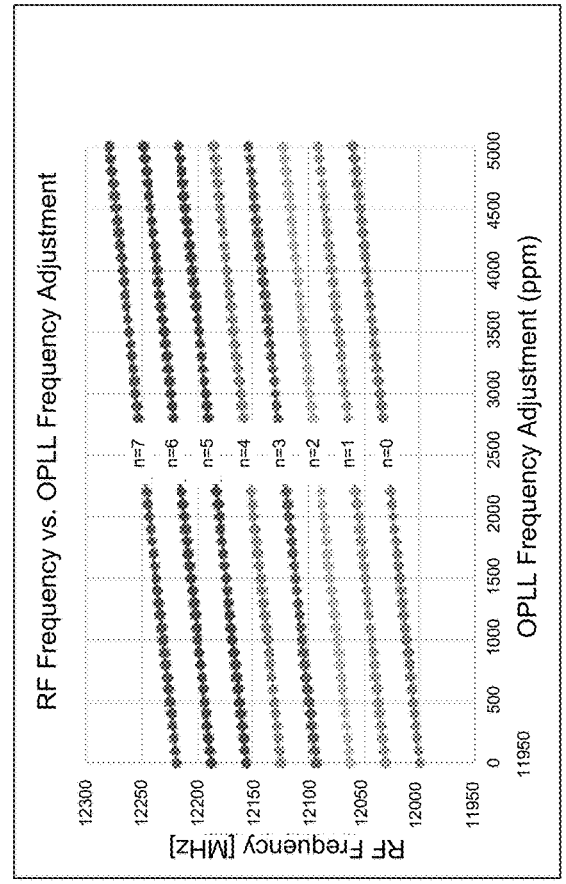
FIG. 6 illustrates an exemplary RF frequency band mapped to an exemplary opportunistic PLL frequency adjustment range for eight different RF PLL ratio sub-integer portions in accordance with various aspects described.

FIG. 5 illustrates how a minimal opportunistic PLL tuning range of around 2500 parts per million (ppm) can cover a 250 MHz frequency band given an RF PLL with a ratio sub-integer portion having 1/8 resolution. For example, if the desired RF frequency is 12,100 MHz then the sub-integer portion of the ratio N for the RF PLL 140 should be selected as 3/8 and the oscillator 126 (FIG. 2) should be adjusted by +500 ppm. While FIG. 5 shows a minimal tuning range for the opportunistic PLL will cover a frequency band of 250 MHz, FIG. 6 illustrates that by having a somewhat wider tuning range of 5000 ppm provides additional flexibility in selecting the RF PLL sub-integer portion of the ratio. For example, if the desired frequency is 12,100 MHz then the sub-integer portion can be selected as 3/8 with +500 ppm adjustment or 2/8 with +3000 ppm adjustment. In this manner, if any of the possible sub-integer portions of ratios would result in in-band spurs or harmonics, another sub-integer portion can be selected (e.g., by control circuitry 160 of FIG. 2) and the opportunistic PLL oscillator adjusted accordingly. In one example, if one of the possible sub-integer portions is 0/8 (e.g., the ratio is an integer), one of the other possible sub-integer portions (e.g., the ratio is a non-integer) could be chosen to avoid harmonics.

Figure 7:
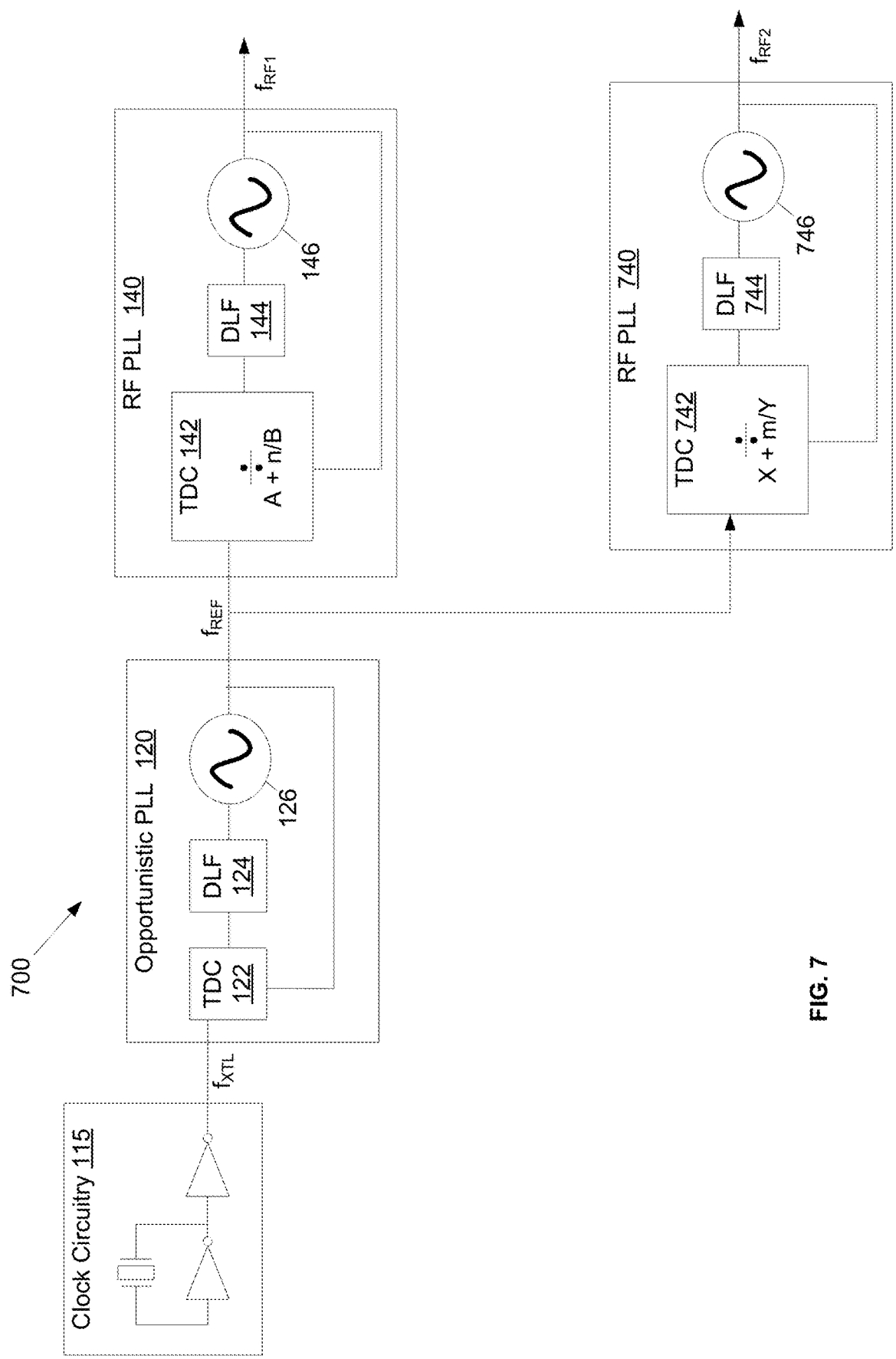
FIG. 7 illustrates an exemplary frequency synthesizer system that includes an opportunistic PLL generating a reference signal for two RF PLLs in accordance with various aspects described.

FIG. 7 illustrates an exemplary frequency synthesizer system 700 that includes the system 100 of FIG. 2 and an additional RF PLL 740 that generates a second RF signal having a second RF frequency. The RF PLL 740 uses the reference signal generated by the opportunistic PLL 120 as a reference signal. The RF PLL 740 will have a different ratio that is determined based on the second RF frequency and the present value of reference signal frequency. In one example the RF PLL 740 generates an RF signal having the same frequency as the RF signal generated by the RF PLL 140 but at a lower power or quality. This allows flexibility in using the low power RF PLL 740 when conditions allow. Thus the opportunistic PLL 120 can be used as a "high quality" reference signal source to multiple other PLLs that are able to adapt their operation based on the present value of the reference signal frequency.

It can be seen from the foregoing description that using an opportunistic PLL to generate a stable reference signal of relatively high frequency while providing modest tuning capability yields a low power solution for generation of very low phase noise RF signals. This leads to improved error vector magnitude (EVM) of both the transmitter and receiver in high-performance demanding standards such as 5G and next generation Wi-Fi protocols. Also stringent requirements for the crystal (frequency, accuracy, and so on) are substantially relaxed so that lower cost components can be used.

Figure 8:
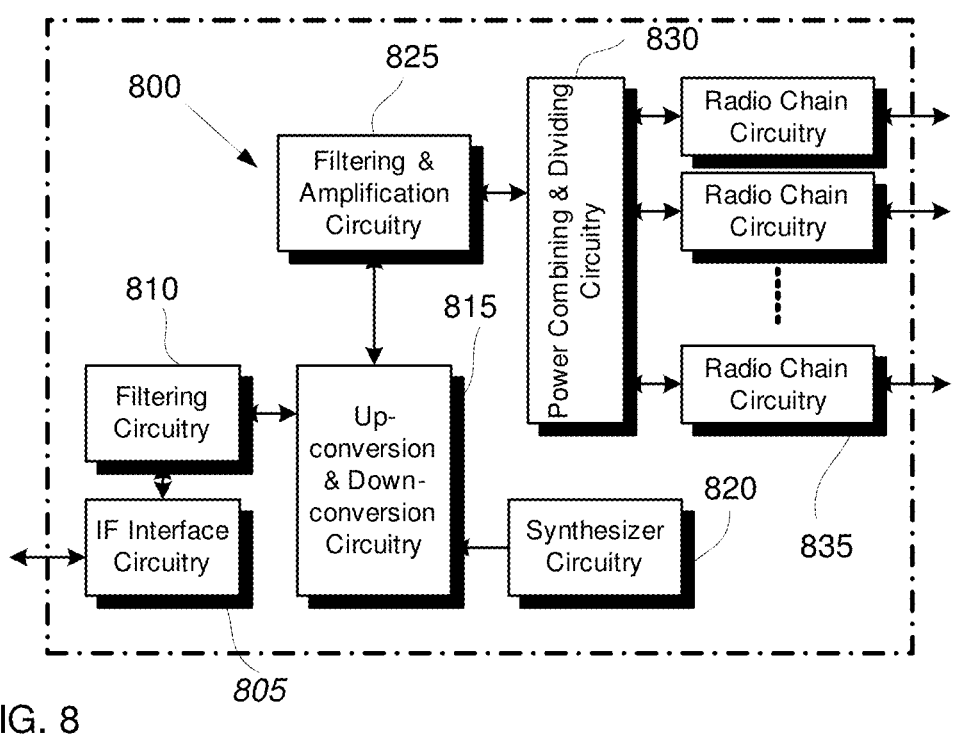
FIG. 8 illustrates an exemplary RF circuitry in accordance with various aspects described.

FIG. 8 illustrates RF circuitry 800 according to some aspects. In an aspect, RF circuitry 800 may include one or more of each of IF interface circuitry 805, filtering circuitry 810, upconversion and downconversion circuitry 815, synthesizer circuitry 820, filtering and amplification circuitry 825, power combining and dividing circuitry 830 and radio chain circuitry 835. The upconversion and downconversion circuitry 815 may include the frequency synthesizer systems 100, 200 of FIGS. 2 and 3 and/or perform the methods 300, 400 of FIGS. 3 and 4.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for using an opportunistic PLL to generate a reference signal and generating an RF signal synchronized to the reference signal according to embodiments and examples described herein.

Example 1 is a frequency synthesizer system configured to generate a radio frequency (RF) signal having a desired radio frequency $f_{RF}$, including a clock circuitry, an opportunistic phase locked loop (PLL), and an RF PLL. The clock circuitry is configured to generate a clock signal having a frequency $f_{XTL}$. The opportunistic PLL is configured to generate a reference signal having a reference frequency $f_{REF}$ that is close to a free-running frequency of an oscillator in the opportunistic PLL. The opportunistic PLL is configured to synchronize the reference signal to the clock signal. The RF PLL configured to generate the RF signal having the desired radio RF frequency $f_{RF}$ and to synchronize the RF signal with the reference signal.

Example 2 includes the subject matter of example 1, including or omitting optional elements, wherein the reference frequency $f_{REF}$ is at least one order of magnitude greater than $f_{XTL}$.

Example 3 includes the subject matter of example 1, including or omitting optional elements, wherein the opportunistic PLL is configured to generate the reference signal in an open loop condition wherein the oscillator in the opportunistic PLL operates at the free-running frequency for the oscillator and in a closed loop condition wherein the reference frequency $f_{REF}$ is approximately the free-running frequency and the reference signal is synchronized with the clock signal.

Example 4 includes the subject matter of example 1, including or omitting optional elements, further including measurement circuitry configured to measure the frequency of the reference signal generated by the opportunistic PLL to determine a measured reference frequency $f_{REF}$.

Example 5 includes the subject matter of example 4, including or omitting optional elements, further including control circuitry configured to determine a ratio (N) between the measured reference frequency $f_{REF}$ and the desired RF frequency $f_{RF}$; adjust the reference frequency $f_{REF}$ based on the ratio; and control a digitally controlled oscillator (DCO) in the RF PLL based on a phase difference between the reference signal and a feedback RF signal to synchronize the RF signal with the reference signal.

Example 6 includes the subject matter of example 5, including or omitting optional elements, wherein the control circuitry is configured to determine the desired RF frequency $f_{RF}$; determine an integer portion (A) of the ratio based on a quotient of the desired RF frequency $f_{RF}$ and the reference frequency $f_{REF}$; determine a frequency modulo $\Delta f_{RF}$ based on a difference between the desired RF frequency $f_{RF}$ and a product of the integer portion A and the reference frequency $f_{REF}$; select a sub-integer ratio denominator (B) based on the frequency modulo; determine a sub-integer ratio numerator n based on a product of the sub-integer ratio denominator B and the frequency modulo $\Delta f_{RF}$ divided by the reference frequency $f_{REF}$; set the ratio (N) to a sum of the integer portion A and a quotient of the sub-integer ratio numerator n divided by the sub-integer ratio denominator B; and control the opportunistic PLL to generate the reference signal having the reference frequency $f_{REF}$=equal to a quotient of the desired RF frequency $f_{RF}$ divided by the ratio N.

Example 7 includes the subject matter of example 6, including or omitting optional elements, wherein the control circuitry is configured to determine at least two ratios and select one of the at least two ratios that is a non-integer.

Example 8 includes the subject matter of example 5, including or omitting optional elements, wherein the control circuitry is further configured to determine that a re-calibration criterion is met and when the re-calibration criterion is met control the opportunistic PLL to generate a new reference signal an open loop condition wherein an oscillator in the opportunistic PLL operates at a new free-running frequency for the oscillator and in a closed loop condition wherein a new reference frequency $f_{REF}$ is approximately the new free-running frequency and the new reference signal is synchronized with the clock signal. The control circuitry is configured to control the RF PLL to determine a new ratio (N) between a new measured reference frequency $f_{REF}$ and the desired RF frequency $f_{RF}$; adjust the new reference frequency $f_{REF}$ based on the ratio; and control the DCO based on a phase difference between the new reference signal and the feedback RF signal to synchronize the RF signal with the new reference signal.

Example 9 is a method to generate a radio frequency (RF) signal having a desired RF frequency $f_{RF}$, including with a clock circuitry, generating a clock signal having a frequency $f_{XTL}$; with an opportunistic phase locked loop (PLL), generating a reference signal having a reference frequency $f_{REF}$ that is close to a free-running frequency of an oscillator in the opportunistic PLL and synchronizing the reference signal with the clock signal; with an RF PLL, generating the RF signal having the desired RF frequency $f_{RF}$; and synchronizing the RF signal with the reference signal.

Example 10 includes the subject matter of example 9, including or omitting optional elements, further including operating the opportunistic PLL in an open loop condition wherein an oscillator in the opportunistic PLL operates at the free-running frequency for the oscillator and operating the opportunistic PLL in a closed loop condition wherein the reference frequency $f_{REF}$ is approximately the free-running frequency and the reference signal is synchronized with the clock signal.

Example 11 includes the subject matter of example 9, including or omitting optional elements, further including measuring the frequency of the reference signal generated by the opportunistic PLL to determine a measured reference frequency $f_{REF}$.

Example 12 includes the subject matter of example 11, including or omitting optional elements, further including determining a ratio (N) between the measured reference frequency $f_{REF}$ and the desired RF frequency $f_{RF}$; adjusting the reference frequency $f_{REF}$ based on the ratio; and controlling a digitally controlled oscillator (DCO) in the RF PLL based on a phase difference between the reference signal and a feedback RF signal to synchronize the RF signal with the reference signal.

Example 13 includes the subject matter of example 12, including or omitting optional elements, further including determining the desired RF frequency $f_{RF}$; determining an integer portion (A) of the ratio based on a quotient of the desired RF frequency $f_{RF}$ and the reference frequency $f_{REF}$; determining a frequency modulo $\Delta f_{RF}$ based on a difference between the desired RF frequency $f_{RF}$ and a product of the integer portion A and the reference frequency $f_{REF}$; selecting a sub-integer ratio denominator (B) based on the frequency modulo; determining a sub-integer ratio numerator n based on a product of the sub-integer ratio denominator B and the frequency modulo $\Delta f_{RF}$ divided by the reference frequency $f_{REF}$; setting the ratio (N) to a sum of the integer portion A and a quotient of the sub-integer ratio numerator n divided by the sub-integer ratio denominator B; and controlling the opportunistic PLL to generate the reference signal having the reference frequency $f_{REF}$=equal to a quotient of the desired RF frequency $f_{RF}$ divided by the ratio N.

Example 14 includes the subject matter of example 12, including or omitting optional elements, further including determining at least two ratios and selecting one of the at least two ratios that is a non-integer as the ratio used by the RF PLL.

Example 15 includes the subject matter of example 12, including or omitting optional elements, further including determining that a re-calibration criterion is met and when the re-calibration criterion is met operating the opportunistic PLL in an open loop condition wherein an oscillator in the opportunistic PLL operates at a new free-running frequency for the oscillator and operating the opportunistic PLL in a closed loop condition wherein a new reference frequency $f_{REF}$ is approximately the new free-running frequency and a new reference signal is synchronized with the clock signal. The method includes determining a new ratio (N) between a new measured reference frequency $f_{REF}$ and the desired RF frequency $f_{RF}$; adjusting the new the reference frequency $f_{REF}$ based on the ratio; and controlling the DCO based on a phase difference between the new reference signal and the feedback RF signal to synchronize the RF signal with the new reference signal.

Example 16 is control circuitry including hardware configured to determine a desired radio frequency (RF) frequency $f_{RF}$; measure a reference frequency $f_{REF}$ of a reference signal generated by an opportunistic phase locked loop (PLL); determine a ratio for an RF PLL that generates an RF signal based on the desired RF frequency $f_{RF}$ and the reference frequency $f_{REF}$; and determine an adjusted value of the reference frequency $f_{REF}$ based on the ratio.

Example 17 includes the subject matter of example 16, including or omitting optional elements, further including hardware configured to control the opportunistic PLL to generate the reference signal in an open loop condition wherein an oscillator in the opportunistic PLL operates at a free-running frequency for the oscillator and in a closed loop condition wherein the reference frequency $f_{REF}$ is approximately the free-running frequency and the reference signal is synchronized with a clock signal.

Example 18 includes the subject matter of example 17, including or omitting optional elements, further including hardware configured to determine that a re-calibration criterion is met and when the re-calibration criterion is met control the opportunistic PLL to generate a new reference signal in an open loop condition wherein an oscillator in the opportunistic PLL operates at a new free-running frequency for the oscillator and in a closed loop condition wherein a new reference frequency $f_{REF}$ is approximately the new free-running frequency and the new reference signal is synchronized with a clock signal. The control circuitry includes hardware configured to control the RF PLL to determine a new ratio (N) between a new measured reference frequency $f_{REF}$ and the desired RF frequency $f_{RF}$; adjust the new reference frequency $f_{REF}$ based on the ratio; and control a digitally controlled oscillator (DCO) in the RF PLL based on a phase difference between the new reference signal and a feedback RF signal to synchronize the RF signal with the new reference signal.

Example 19 includes the subject matter of example 16, including or omitting optional elements, further including hardware configured to determine an integer portion (A) of the ratio based on a quotient of the desired RF frequency $f_{RF}$ and the reference frequency $f_{REF}$; determine a frequency modulo $\Delta f_{RF}$ based on a difference between the desired RF frequency $f_{RF}$ and a product of the integer portion A and the reference frequency $f_{REF}$; select a sub-integer ratio denominator (B) based on the frequency modulo; determine a sub-integer ratio numerator n based on a product of the sub-integer ratio denominator B and the frequency modulo $\Delta f_{RF}$ divided by the reference frequency $f_{REF}$; set the ratio (N) to a sum of the integer portion A and a quotient of the sub-integer ratio numerator n divided by the sub-integer ratio denominator B; and control the opportunistic PLL to generate the reference signal having the reference frequency $f_{REF}$=equal to a quotient of the desired RF frequency $f_{RF}$ divided by the ratio N.

Example 20 includes the subject matter of example 16, including or omitting optional elements, further including hardware configured to determine at least two ratios and select one of the at least two ratios that is a non-integer as the ratio used by the RF PLL.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. A frequency synthesizer system configured to generate a radio frequency (RF) signal having a desired radio frequency $f_{RF}$, comprising:
    a clock circuitry configured to generate a clock signal having a frequency $f_{XTL}$;
    an opportunistic phase locked loop (PLL) configured to generate a reference signal having a reference frequency $f_{REF}$ that is close to a free-running frequency of an oscillator in the opportunistic PLL, wherein the opportunistic PLL is configured to synchronize the reference signal to the clock signal; and
    an RF PLL configured to generate the RF signal having the desired radio RF frequency $f_{RF}$ and to synchronize the RF signal with the reference signal.

2. The frequency synthesizer system of claim 1, wherein the reference frequency $f_{REF}$ is at least one order of magnitude greater than $f_{XTL}$.

3. The frequency synthesizer system of claim 1, wherein the opportunistic PLL is configured to generate the reference signal:
    in an open loop condition wherein the oscillator in the opportunistic PLL operates at the free-running frequency for the oscillator; and
    in a closed loop condition wherein the reference frequency $f_{REF}$ is approximately the free-running frequency and the reference signal is synchronized with the clock signal.

4. The frequency synthesizer system of claim 1, further comprising measurement circuitry configured to measure the frequency of the reference signal generated by the opportunistic PLL to determine a measured reference frequency $f_{REF}$.

5. The frequency synthesizer system of claim 4, further comprising control circuitry configured to:
determine a ratio (N) between the measured reference frequency $f_{REF}$ and the desired RF frequency $f_{RF}$;
adjust the reference frequency $f_{REF}$ based on the ratio; and
control a digitally controlled oscillator (DCO) in the RF PLL based on a phase difference between the reference signal and a feedback RF signal to synchronize the RF signal with the reference signal.

6. The frequency synthesizer system of claim 5, wherein the control circuitry is configured to:
determine the desired RF frequency $f_{RF}$;
determine an integer portion (A) of the ratio based on a quotient of the desired RF frequency $f_{RF}$ and the reference frequency $f_{REF}$;
determine a frequency modulo $\Delta f_{RF}$ based on a difference between the desired RF frequency $f_{RF}$ and a product of the integer portion A and the reference frequency $f_{REF}$;
select a sub-integer ratio denominator (B) based on the frequency modulo;
determine a sub-integer ratio numerator n based on a product of the sub-integer ratio denominator B and the frequency modulo $\Delta f_{RF}$ divided by the reference frequency $f_{REF}$;
set the ratio (N) to a sum of the integer portion A and a quotient of the sub-integer ratio numerator n divided by the sub-integer ratio denominator B; and
control the opportunistic PLL to generate the reference signal having the reference frequency $f_{REF}$=equal to a quotient of the desired RF frequency $f_{RF}$ divided by the ratio N.

7. The frequency synthesizer system of claim 6, wherein the control circuitry is configured to:
determine at least two ratios; and
select one of the at least two ratios that is a non-integer.

8. The frequency synthesizer system of claim 5, wherein the control circuitry is further configured to:
determine that a re-calibration criterion is met;
when the re-calibration criterion is met:
control the opportunistic PLL to generate a new reference signal:
an open loop condition wherein an oscillator in the opportunistic PLL operates at a new free-running frequency for the oscillator; and
in a closed loop condition wherein a new reference frequency $f_{REF}$ is approximately the new free-running frequency and the new reference signal is synchronized with the clock signal; and
control the RF PLL to:
determine a new ratio (N) between a new measured reference frequency $f_{REF}$ and the desired RF frequency $f_{RF}$;
adjust the new reference frequency $f_{REF}$ based on the ratio; and
control the DCO based on a phase difference between the new reference signal and the feedback RF signal to synchronize the RF signal with the new reference signal.

9. A method to generate a radio frequency (RF) signal having a desired RF frequency $f_{RF}$, comprising:
with a clock circuitry, generating a clock signal having a frequency $f_{XTL}$;
with an opportunistic phase locked loop (PLL):
generating a reference signal having a reference frequency $f_{REF}$ that is close to a free-running frequency of an oscillator in the opportunistic PLL; and
synchronizing the reference signal with the clock signal;
with an RF PLL:
generating the RF signal having the desired RF frequency $f_{RF}$; and
synchronizing the RF signal with the reference signal.

10. The method of claim 9, further comprising:
operating the opportunistic PLL in an open loop condition wherein an oscillator in the opportunistic PLL operates at the free-running frequency for the oscillator; and
operating the opportunistic PLL in a closed loop condition wherein the reference frequency $f_{REF}$ is approximately the free-running frequency and the reference signal is synchronized with the clock signal.

11. The method of claim 9, further comprising measuring the frequency of the reference signal generated by the opportunistic PLL to determine a measured reference frequency $f_{REF}$.

12. The method of claim 11, further comprising:
determining a ratio (N) between the measured reference frequency $f_{REF}$ and the desired RF frequency $f_{RF}$;
adjusting the reference frequency $f_{REF}$ based on the ratio; and
controlling a digitally controlled oscillator (DCO) in the RF PLL based on a phase difference between the reference signal and a feedback RF signal to synchronize the RF signal with the reference signal.

13. The method of claim 12, further comprising:
determining the desired RF frequency $f_{RF}$;
determining an integer portion (A) of the ratio based on a quotient of the desired RF frequency $f_{RF}$ and the reference frequency $f_{REF}$;
determining a frequency modulo $\Delta f_{RF}$ based on a difference between the desired RF frequency $f_{RF}$ and a product of the integer portion A and the reference frequency $f_{REF}$;
selecting a sub-integer ratio denominator (B) based on the frequency modulo;
determining a sub-integer ratio numerator n based on a product of the sub-integer ratio denominator B and the frequency modulo $\Delta f_{RF}$ divided by the reference frequency $f_{REF}$;
setting the ratio (N) to a sum of the integer portion A and a quotient of the sub-integer ratio numerator n divided by the sub-integer ratio denominator B; and
controlling the opportunistic PLL to generate the reference signal having the reference frequency $f_{REF}$=equal to a quotient of the desired RF frequency $f_{RF}$ divided by the ratio N.

14. The method of claim 12, further comprising:
determining at least two ratios; and
selecting one of the at least two ratios that is a non-integer as the ratio used by the RF PLL.

15. The method of claim 12, further comprising:
determining that a re-calibration criterion is met;
when the re-calibration criterion is met:
operating the opportunistic PLL in an open loop condition wherein an oscillator in the opportunistic PLL operates at a new free-running frequency for the oscillator; and
operating the opportunistic PLL in a closed loop condition wherein a new reference frequency $f_{REF}$ is approximately the new free-running frequency and a new reference signal is synchronized with the clock signal;

determining a new ratio (N) between a new measured reference frequency $f_{REF}$ and the desired RF frequency $f_{RF}$;

adjusting the new the reference frequency $f_{REF}$ based on the ratio; and controlling the DCO based on a phase difference between the new reference signal and the feedback RF signal to synchronize the RF signal with the new reference signal.

16. Control circuitry, comprising hardware configured to:
determine a desired radio frequency (RF) frequency $f_{RF}$;
measure a reference frequency $f_{REF}$ of a reference signal generated by an opportunistic phase locked loop (PLL);
determine a ratio for an RF PLL that generates an RF signal based on the desired RF frequency $f_{RF}$ and the reference frequency $f_{REF}$; and
determine an adjusted value of the reference frequency $f_{REF}$ based on the ratio.

17. The control circuitry of claim 16, further comprising hardware configured to control the opportunistic PLL to generate the reference signal:
in an open loop condition wherein an oscillator in the opportunistic PLL operates at a free-running frequency for the oscillator; and
in a closed loop condition wherein the reference frequency $f_{REF}$ is approximately the free-running frequency and the reference signal is synchronized with a clock signal.

18. The control circuitry of claim 17, further comprising hardware configured to:
determine that a re-calibration criterion is met;
when the re-calibration criterion is met:
control the opportunistic PLL to generate a new reference signal:
in an open loop condition wherein an oscillator in the opportunistic PLL operates at a new free-running frequency for the oscillator; and
in a closed loop condition wherein a new reference frequency $f_{REF}$ is approximately the new free-running frequency and the new reference signal is synchronized with a clock signal; and
control the RF PLL to:
determine a new ratio (N) between a new measured reference frequency $f_{REF}$ and the desired RF frequency $f_{RF}$;
adjust the new reference frequency $f_{REF}$ based on the ratio; and
control a digitally controlled oscillator (DCO) in the RF PLL based on a phase difference between the new reference signal and a feedback RF signal to synchronize the RF signal with the new reference signal.

19. The control circuitry of claim 16, further comprising hardware configured to:
determine an integer portion (A) of the ratio based on a quotient of the desired RF frequency $f_{RF}$ and the reference frequency $f_{REF}$;
determine a frequency modulo $\Delta f_{RF}$ based on a difference between the desired RF frequency $f_{RF}$ and a product of the integer portion A and the reference frequency $f_{REF}$;
select a sub-integer ratio denominator (B) based on the frequency modulo;
determine a sub-integer ratio numerator n based on a product of the sub-integer ratio denominator B and the frequency modulo $\Delta f_{RF}$ divided by the reference frequency $f_{REF}$;
set the ratio (N) to a sum of the integer portion A and a quotient of the sub-integer ratio numerator n divided by the sub-integer ratio denominator B; and
control the opportunistic PLL to generate the reference signal having the reference frequency $f_{REF}$=equal to a quotient of the desired RF frequency $f_{RF}$ divided by the ratio N.

20. The control circuitry of claim 16, further comprising hardware configured to:
determine at least two ratios; and
select one of the at least two ratios that is a non-integer as the ratio used by the RF PLL.

* * * * *